United States Patent
Hoyer et al.

(10) Patent No.: US 6,754,862 B1
(45) Date of Patent: Jun. 22, 2004

(54) GAINING ACCESS TO INTERNAL NODES IN A PLD

(75) Inventors: Bryan H. Hoyer, Boulder Creek, CA (US); Michael C. Fairman, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 483 days.

(21) Appl. No.: 09/802,480

(22) Filed: Mar. 9, 2001

Related U.S. Application Data

(60) Provisional application No. 60/188,348, filed on Mar. 9, 2000.

(51) Int. Cl.[7] ............................................. G01R 31/25
(52) U.S. Cl. .................................................... 714/725
(58) Field of Search ................................ 714/726, 725, 714/727, 39; 326/16, 40; 716/16, 4, 5

(56) References Cited

U.S. PATENT DOCUMENTS

| | | | |
|---|---|---|---|
| 4,696,004 A | 9/1987 | Nakajima et al. ........... | 714/736 |
| 4,788,492 A | 11/1988 | Schubert ...................... | 714/724 |
| 4,835,736 A | 5/1989 | Easterday ................... | 711/218 |
| 4,847,612 A | 7/1989 | Kaplinsky .................... | 326/10 |
| 4,873,459 A | 10/1989 | El Gamal et al. ............. | 326/41 |
| 5,036,473 A | 7/1991 | Butts et al. | |
| 5,058,114 A | 10/1991 | Kuboki et al. | |
| 5,124,588 A | 6/1992 | Baltus et al. | |
| 5,329,470 A | 7/1994 | Sample et al. | |
| 5,365,165 A | 11/1994 | El-Ayat et al. | |
| 5,425,036 A | 6/1995 | Liu et al. | |
| 5,452,231 A | 9/1995 | Butts et al. | |
| 5,568,437 A | 10/1996 | Jamal | |
| 5,572,712 A | 11/1996 | Jamal | |
| 5,629,617 A | 5/1997 | Uhling et al. | |
| 5,640,542 A | 6/1997 | Whitsel et al. | |
| 5,661,662 A | 8/1997 | Butts et al. | |
| 5,717,695 A | 2/1998 | Manela et al. | |
| 5,717,699 A | 2/1998 | Haag et al. | |
| 5,764,079 A | 6/1998 | Patel et al. | |
| 5,821,771 A | 10/1998 | Patel et al. | |
| 5,870,410 A | 2/1999 | Norman et al. | |
| 5,960,191 A | 9/1999 | Sample et al. | |

(List continued on next page.)

FOREIGN PATENT DOCUMENTS

DE        4042262        7/1992

OTHER PUBLICATIONS

Jaini et al. , Observing test response of embedded cores through surrounding logic, 1999, IEEE, p. I–119 to I–123.*

(List continued on next page.)

*Primary Examiner*—Albert Decady
*Assistant Examiner*—Shelly A Chase
(74) *Attorney, Agent, or Firm*—Beyer Weaver & Thomas, LLP.

(57) ABSTRACT

Internal registers of a PLD are exposed for debugging using a JTAG port and a scan chain. The user of a PLD identifies registers at the source code level. These registers are automatically inserted in a scan chain. An EDA software tool provides a means of choosing a register from the electronic design. The EDA tool connects the selected register to the JTAG scan chain and passes information to the software about the location in the scan chain. The EDA tool provides for scanning of the chain under automatic or manual control. The selected nodes are extracted from the chain and displayed in a user-specified format. Registers in encrypted blocks are exposed. The vendor of the block decides which registers are of importance. Once selected, the vendor creates a "debugging" file which is delivered to the customer along with the encrypted block. The debugging file contains the names of the registers, their data type, and their symbolic values.

18 Claims, 8 Drawing Sheets

U.S. PATENT DOCUMENTS

| | | | |
|---|---|---|---|
| 5,983,277 | A | 11/1999 | Heile et al. .................. 709/232 |
| 6,014,334 | A | 1/2000 | Patel et al. |
| 6,016,563 | A | 1/2000 | Fleisher ........................ 714/725 |
| 6,020,758 | A | 2/2000 | Patel et al. .................... 326/40 |
| 6,104,211 | A | 8/2000 | Alfke ........................... 326/91 |
| 6,107,821 | A | 8/2000 | Kelem et al. ................. 326/38 |
| 6,157,210 | A | 12/2000 | Zaveri et al. .................. 326/40 |
| 6,182,247 | B1 * | 1/2001 | Herrmann et al. ............ 714/39 |
| 6,212,650 | B1 | 4/2001 | Guccione ...................... 714/32 |
| 6,223,148 | B1 | 4/2001 | Stewart et al. ................ 703/25 |
| 6,247,147 | B1 * | 6/2001 | Beenstra et al. .............. 714/39 |
| 6,259,271 | B1 | 7/2001 | Couts-Martin et al. ....... 326/40 |
| 6,286,114 | B1 * | 9/2001 | Veenstra et al. .............. 714/39 |
| 6,317,860 | B1 | 11/2001 | Heile ............................. 716/5 |
| 6,321,369 | B1 | 11/2001 | Heile et al. ................... 716/11 |
| 6,389,558 | B1 | 5/2002 | Herrmann et al. ............ 714/39 |
| 6,460,148 | B2 | 10/2002 | Veenstra et al. .............. 714/38 |
| 6,481,000 | B1 | 11/2002 | Zaveri et al. .................. 716/17 |

OTHER PUBLICATIONS

Touba et al., Testing embedded cores using partial isolation rings, 1997, IEEE, p. 10–16.*

Marantz, Joshua, "Enhanced Visibility and Performance in Functional Verification by Reconstruction", Proceedings of the 35$^{th}$ Annual Conference on Design Automation Conference, pp. 164–169. 1998.

Stroud, Charles et al., "Evaluation of FPGA Resources for Built–in–Self–test of Programmable Logic Blocks", Proceedings of the 1996 ACM 4$^{th}$ International Symposium on Field–programmable Gate Arrays, p. 107. 1996.

Collins, Robert R., "Overview of Pentium Probe Mode", (www.x86.org/articles/problemed/ProbeMode.htm), Aug. 21, 1998, 3 pgs.

Collins, Robert R., "ICE Mode and the Pentium Processor", (www.x86.org/ddj/Nov97/Nov97.htm), Aug. 21, 1986, 6 Pgs.

"PentiumPro Family Developer's Manual", vol. 1: Specifications, Intel®Corporation, 1996, 9 Pgs.

"Pentium® Processor User's Manual", vol. 1, Intel®Corporation, 1993, Pgs. 3–11.

Xilinx, Inc.: ISE Logic Design Tools: ChipScope.

Synplicity, Inc. "Identify ™RTL Debugger", 2003; pp. 1–2.

Altera, Signal Tap Analysis in the Quartus II Software Version 2.0; Sep. 2002; Version. 2.1; Altera Corporation.

* cited by examiner

GAINING ACCESS TO INTERNAL NODES IN A PLD

This application claims priority of U.S. provisional patent application No. 60/188,348, filed Mar. 9, 2000 entitled "Method of Gaining Access to Internal Nodes in a PLD," which is hereby incorporated by reference.

This application is related to U.S. patent application Ser. No. 08/958,435, filed Oct. 27, 1997, entitled "Embedded Logic Analyzer For A Programmable Logic Device," now U.S. Pat. No. 6,182,247 to U.S. patent application Ser. No. 09/186,607 filed Nov. 6, 1998, entitled "Enhanced Embedded Logic Analyzer," now U.S. Pat. No. 6,286,114 and to U.S. patent application Ser. No. 09/186,608 filed Nov. 6, 1998, entitled "Enhanced Embedded Logic Analyzer:," now U.S. Pat. No. 6,247,147.

FIELD OF THE INVENTION

The present invention relates generally to analysis of a hardware device in connection with a computer system. More specifically, the present invention relates to analysis of internal registers within a programmable semiconductor device for purposes of debugging.

BACKGROUND OF THE INVENTION

In the field of electronics, various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits (e.g., ASICs), and in the design of custom configurations for programmable integrated circuits. Integrated circuits that may be programmable by a customer to produce a custom design for that customer include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

In the course of generating a design for a PLD, programming the PLD and checking its functionality on the circuit board or in the system for which it is intended, it is important to be able to debug the PLD because a design is not always perfect the first time. Before a PLD is actually programmed with an electronic design, a simulation and/or timing analysis may be used to debug the electronic design. However, once the PLD has been programmed and is operating within a working system, it is also important to be able to debug the PLD in this real-world environment.

And although a simulation may be used to debug many aspects of a PLD, it is nearly impossible to generate a simulation that will accurately exercise all of the features of the PLD on an actual circuit board operating in a complex system. For example, a simulation may not be able to provide timing characteristics that are similar to those that will actually be experienced by the PLD in a running system; e.g., simulation timing signals may be closer or farther apart than what a PLD will actually experience in a real system.

In addition to the difficulties in generating a comprehensive simulation, other circuit board variables such as temperature changes, capacitance, noise, and other factors may cause intermittent failures in a PLD that are only evident when the PLD is operating within a working system. Still further, it can be difficult to generate sufficiently varied test vectors to stress the PLD design to the point where most bugs are likely to be observed. For example, a PLD malfunction can result when the PLD is presented with stimuli that the designer did not expect, and therefore did not take into account during the design and simulation of the PLD. Such malfunctions are difficult to anticipate and must be debugged in the context of the complete system. Thus, simulation of an electronic design is useful, but usually cannot debug a PLD completely.

One approach to debugging a hardware device within a working system is to use a separate piece of hardware equipment called a logic analyzer to analyze signals present on the pins of a hardware device. (For example, the HP1670A Series Logic Analyzer from Hewlett-Packard Company.) Typically, a number of probe wires are connected manually from the logic analyzer to pins of interest on the hardware device in order to monitor signals on those pins. The logic analyzer captures and stores these signals. However, the use of an external logic analyzer to monitor pins of a hardware device has certain limitations when it comes to debugging such a device. For example, such an external logic analyzer can only connect to and monitor the external pins of the hardware device. Thus, there is no way to connect to and monitor signals that are internal to the hardware device. Unfortunately, when programming a hardware device such as a PLD, it would be useful to be able to monitor some of these internal signals in order to debug the PLD.

Although some custom hardware devices may come ready-made with some internal debugging hardware, this debugging hardware is typically hardwired to route specific internal signals and cannot be readily changed by an engineer who wishes to look at other signals. Also, with such built-in debugging it is not possible to choose any signal to monitor that the engineer desires. Further, creating an electronic design for a PLD is an iterative process that requires creative debugging by an engineer who may wish to view almost any internal signal, and who may change his mind fairly frequently in the course of debugging a PLD within a system.

As explained above, debugging discrete components on a circuit board used to be simpler in that one could look at most any input or output. Now that components are inside an integrated circuit, the ability to look at intermediate nodes and signals is inhibited. In other words, while the inputs and resultant outputs of a chip are visible, the intermediate points inside the chip are not. The overall problem then is the visibility of nodes and signals inside a chip.

Various prior art techniques have been used to solve different aspects of this problem, i.e., techniques for looking at internal signals. Actel Corporation of Sunnyvale, Calif. provides a product named SILICON EXPLORER which is an external logic analyzer with JTAG capability. This tool, however, is only able to route two internal signal lines to the outside of a chip for analysis. All internal registers are not visible. These signals are specified by the user and may not be flexibly reassigned to other signals. Furthermore, the signals are referenced via the netlists and are not identified in the original source code.

Prior art techniques that allow identification of signals by reference to a netlist can be useful; however, identifying a signal in a netlist is always a complicated and time-consuming technique. It would be far easier for a design engineer to be able to identify registers of interest in the source code directly while the engineer is creating that source code.

In the realm of processors, various tools exist for halting and dumping the contents of a processor but there is no capability for the easy identification of internal registers for analysis. With ASICs, it is known to create a built in JTAG scan chain with which to scan out information. This scan chain, though, is only for use while the device is in a test fixture and is being tested for functionality. The JTAG scan chain is not used while the device is operational in a system.

Intel Corporation of Santa Clara, Calif. uses a JTAG port to control access to specified debug registers for help in debugging a central processing unit (CPU). Because a CPU is a known design, it is known beforehand exactly how many debug registers will be needed and control is simpler. With a PLD, however, each user-implemented design will be custom; it is unknown ahead of time what that design will be and how many debug registers might be needed. Different designs will require different debug registers. Thus the straightforward technique used by Intel with a known design of a CPU would not be appropriate with a PLD.

U.S. patent application Ser. No. 08/958,435, now U.S. Pat. No. 6,182,247 referenced above discloses an advantageous apparatus and technique that allow an embedded logic analyzer to flexibly analyze internal signals of interest in an electronic design, such as within a programmable logic device (PLD). The other two above-referenced patent applications disclose a technique for embedding a separate logic analyzer in a PLD for later analysis of internal signals. These techniques, however, all impact the design in that the separate logic analyzer takes up resources in the design and may not always be the optimal solution. Thus there is room for improvement in the analysis of internal signals of a PLD for debugging purposes.

As described above, in the course of working with blocks of programmable logic it is often necessary to reveal the contents of internal registers or nodes. When programming an ASIC this can be accomplished via a scan chain connected to the JTAG port. Registers of interests are inserted in the manufacturing test scan chain and then test software can be written to reveal their contents. In programmable logic, though, the manufacturing scan chains verify the electronic design prior to the download of the end user's design. In other words, scan chains are inserted to test the electronic design but are not part of the end user's design, therefore end users do not have the option of inserting scan chains. An end user could of course rebuild the test logic in the programmable part of the chip but this is undesirable as it consumes both engineering development time and programmable resources. It is possible to insert an embedded logic analyzer into a programmable device (as mentioned above), but this solution is not always desirable as it performs capture into a memory buffer that uses chip resources.

What is desirable then is a technique for identifying internal registers in the source code and for automatically making these registers visible during testing or later use without significantly impacting an electronic design.

SUMMARY OF THE INVENTION

To achieve the foregoing, and in accordance with the purpose of the present invention, a debugging device and technique are disclosed that allow internal registers of a PLD to be exposed for debugging.

The present invention provides a means for a user of a programmable logic device to identify registers or nodes of interest at the source code level and then have these registers automatically inserted in a scan chain where they can be accessed by test software provided by the device manufacturer. Initially, the EDA software tool provides a means of choosing a node or register of interest from the electronic design. Next, the EDA tool connects the selected node to the JTAG scan chain and passes information to the control/post processing software about the location of the node in the scan chain. The EDA tool provides for scanning of the chain under automatic or manual control. The selected nodes are extracted from the chain and displayed in a user-specified format.

In a second embodiment of the invention, registers in encrypted blocks can be exposed. Before a particular encrypted block is sold to a user, the vendor of the block decides which registers are of importance or would be interesting to view for an engineer who is attempting to debug an electronic design. The vendor may select these registers on their own, or may select registers based upon input from its various customers. Once these registers are selected, the vendor creates a "debugging" file which is delivered to the customer along with the encrypted block. The "debugging" file contains the names of the registers (unencrypted) in the source code to which a user will have access. The user may then convey these names to the EDA tool so that they are exposed during debugging.

This embodiment of the present invention provides numerous advantages for the vendor of an encrypted block intended for an electronic design. Although a vendor wishes to allow an engineer to debug a system of which their block is a part, they do not wish to reveal their source code or go to extra efforts. Making use of this embodiment, a vendor need not change their source code to allow debugging to occur, and need not reveal their source code to the engineer user. The vendor simply creates a simple "debugging file" with names of registers to be viewed and their symbolic values.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

In order to develop a design for programming an electronic design such as a programmable logic device (PLD), a programmable logic development system is used. As used herein, "electronic design" refers to circuit boards and systems including multiple electronic devices and multi-chip modules, as well as integrated circuits. For convenience, the following discussion will generally refer to "integrated circuits", or to "PLDs", although the invention is not so limited.

Programmable Logic Development System

Figure 1:
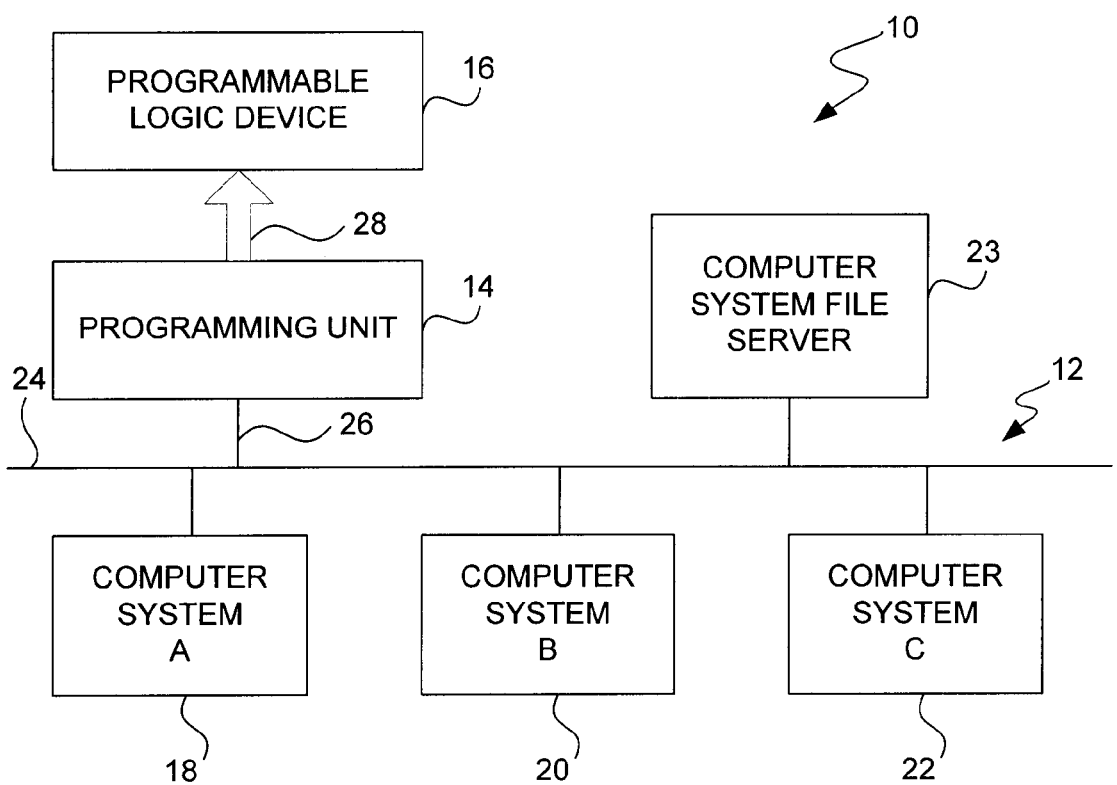
FIG. 1 is a block diagram of a programmable logic development system according to one embodiment of the present invention.

FIG. 1 is a block diagram of an embodiment of a programmable logic development system 10 that includes a computer network 12, a programming unit 14 and a programmable logic device 16 that is to be programmed. Computer network 12 includes any number of computers connected in a network such as computer system A 18, computer system B 20, computer system C 22 and computer system file server 23 all connected together through a network connection 24. Computer network 12 is connected via a cable 26 to programming unit 14, which in turn is connected via a programming cable 28 to the PLD 16. Alternatively, only one computer system could be directly connected to programming unit 14. Furthermore, computer network 12 need not be connected to programming unit 14 at all times, such as when a design is being developed, but could be connected only when PLD 16 is to be programmed.

Programming unit 14 may be any suitable hardware programming unit that accepts program instructions from computer network 12 in order to program PLD 16. By way of example, programming unit 14 may include an add-on logic programmer card for a computer, and a master programming unit, such as are available from Altera Corporation of San Jose, Calif. PLD 16 may be present in a system or in a programming station. In operation, any number of engineers use computer network 12 in order to develop programming instructions using an electronic design automation software tool. Once a design has been developed and entered by the engineers, the design is compiled and verified before being downloaded to the programming unit. The programming unit 14 is then able to use the downloaded design in order to program PLD 16.

For the purposes of debugging a PLD according to an embodiment of the present invention, any of the computers shown or others may be used by an engineer to compile a design. Furthermore, programming cable 28 may be used to receive data from the PLD, or a separate debugging cable may be used to directly connect a computer with device 16. Such a programmable logic development system is used to create an electronic design. A user creates a design by specifying and implementing functional blocks, as will now be described in the context of an exemplary design methodology.

Design Methodology

Figure 2:
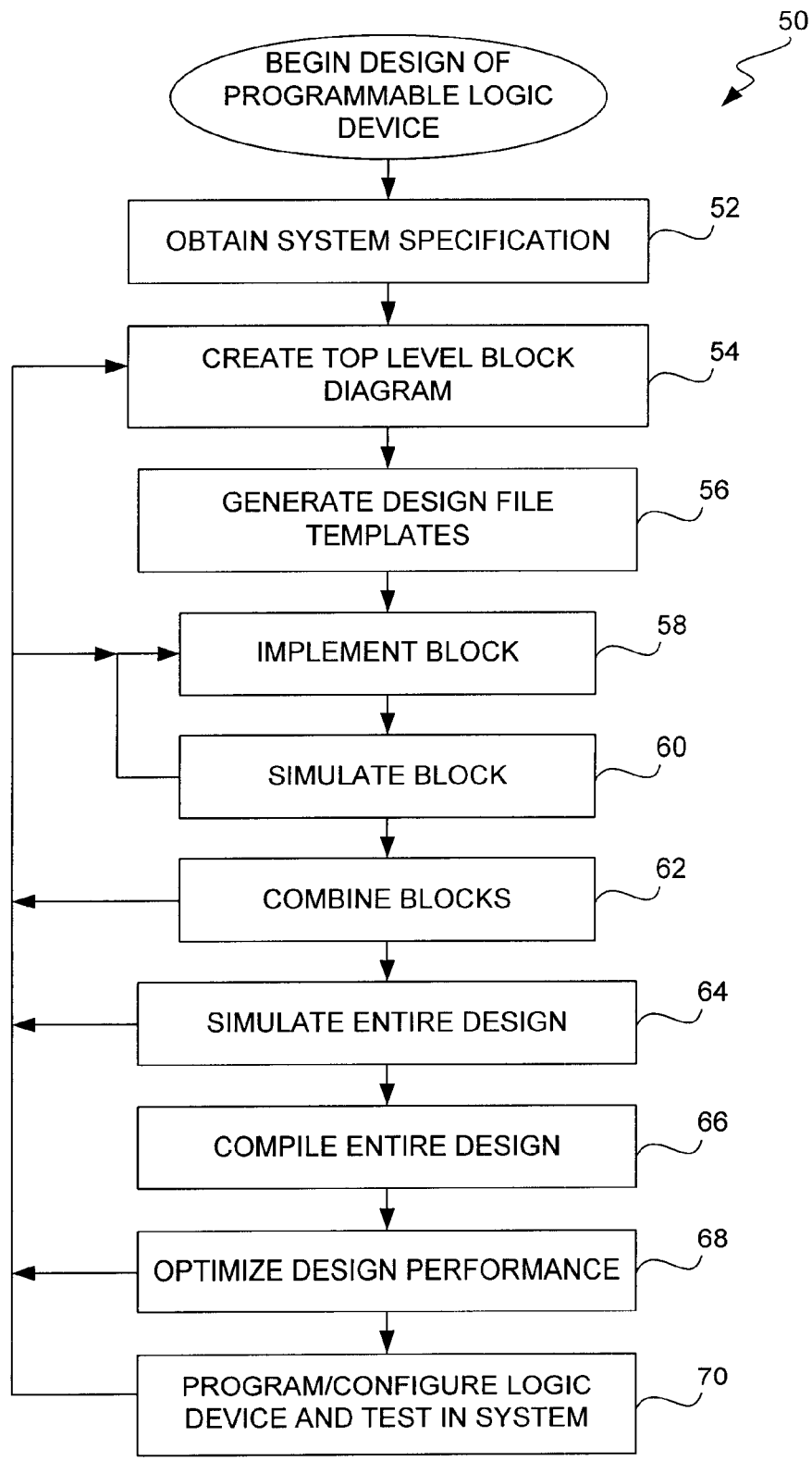
FIG. 2 is a flowchart of a design methodology used to design a programmable logic device according to one embodiment of the present invention.

FIG. 2 shows a design methodology 50 for using a system design specification in order to develop a design with which to program a PLD. It should be appreciated that the present invention may be practiced in the context of a wide variety of design methodologies. By way of example, the work group computing techniques and system of the present invention work well with an electronic design automation (EDA) software tool within the framework of the methodology of FIG. 2.

In step 52 a system specification for the PLD to be programmed is obtained. This specification is an external document or file that describes, for example, the device pin names, the functionality of each of the pins, the desired system functionality, timing and resource budgets, and the like.

Once the system specification is obtained, creation of a design using functional block diagrams is begun. In step 54 a top-level block diagram is created in which connections between lower-level designs blocks are specified. In this block, the target device, speed grade, and key timing requirements may be specified. Those skilled in the art will recognize that this top-level block may also include blocks that have already been developed or implemented or that have been obtained from a third party provider. This top-level block may also be converted into an HDL file, or the like, for use in other related design tools, such as an external simulator.

Step 56 includes generating design file templates with the EDA tool for all blocks present in the top-level block diagram of step 54. After the designer has created a block which has not yet been implemented, the system may generate a design file template. Such templates may display a block in a window format including, for example, a title, a date, etc. around the boundaries. It may also include some details of the functional content depicted within the window. The design file templates may be in any specified design format including VHDL, AHDL, Verilog, block diagram, schematic, or other like format. In the case of a VHDL block the template may also include much of the formatting and necessary syntax for any VHDL block. The user need only take the template and add the small portion of VHDL syntax required to implement his function. For example, the user may need only add syntax defining a particular AND gate operation. Normal design, such as VHDL or other IEEE standard, requires large amounts of text to adequately set up the design block.

Those skilled in the art will recognize that design file templates such as these can be used as starting points for the design of the structural or functional entities needed by the design. Thus, a design file template may serve as a reusable object for different instances of a block in one or more designs. More importantly, design file templates will be employed to reduce the amount of labor that the designer must expend to generate the logic in the blocks. In one embodiment, the generation of the design file templates is done in such a way that the templates can be updated later if the top-level block diagram changes.

Next, in step 58, each of the blocks of the top-level block is implemented using the EDA tool. It is noted that for more complicated designs, there may be additional levels of block diagrams (i.e., blocks within blocks). If changes are required at the top-level then the top-level block diagram is updated and the sub-designs are preferably automatically updated as well.

Furthermore, a block may be compiled through to a fitting stage for a particular integrated circuit die to provide information about resource utilization, timing performance, etc., as required for a given design. As such, it is envisioned that some timing optimization may be performed during step 58. This sequence illustrates a style of design in which an engineer first designs, then compiles and simulates, and then returns to design again if the simulation results are not satisfactory. In another style, an engineer may iterate through a number of design followed by simulation loops before finally compiling the complete design.

Concerning block implementation order, one or more of the following factors can be used to determine implementation order: (1) the complexity of a block; (2) the uncertainty or risk associated with a block; and/or (3) how far upstream and/or downstream in a given data-path the block resides. Each of steps 60, 62, 64, 68 and 70 may also lead back to this block implementation step for additional implementation necessitated by later changes in the design.

In step 60 a block is simulated functionally at the source level using a behavioral simulator and vectors generated by using a VHDL or Verilog test bench, for example. The simulation results can then be displayed or otherwise presented/recorded as waveforms, text or annotated onto the source files. The designer may also return to step 58 to implement a block again. Also, at this point a block may be compiled or a timing analysis performed.

Once the designer is satisfied with the simulation results, in step 62 the block is combined with other blocks and the resulting group is simulated together. In some cases, it may be useful to complete a full compilation to provide critical resource and timing information. Also, output simulation vectors from one block may become the input simulation vectors to the next block. The designer may also return to step 54 to modify the top-level block or to step 58 to implement a block again.

Next, in step 64, the entire design is simulated functionally at the source level using a behavioral simulator. Preferably, the top-level block diagram is fully specified before simulation and shows complete design connectivity. Vectors can be generated using a VHDL or Verilog test bench. Again, the simulation results can be displayed either as waveforms or annotated onto the source files. The designer may also return to step 54 to modify the top-level block or to step 58 to implement a block again. In step 66 the entire design is compiled through to a file containing the information needed to program a PLD to implement the user's design, such as to a "programming output file".

A wide variety of compile techniques may be used depending upon the type of design being created. By way of example, a few examples of compilation are presented below. For a PLD, compilation includes the steps of synthesis, place and route, generation of programming files and simulation. For a traditional integrated circuit design with a custom layout, compilation includes a layout version schematic, a design rule checker and simulations. For integrated circuit design using a high level design tool, compilation includes synthesis from a language such as VHDL or Verilog, automatic place and route and simulations. For printed circuit boards, compilation includes automatic routing, design rule checking, lumped parameter extraction and simulation. Of course, other types of compilation and variations on the above are possible. Within the context of the present invention, any of the above compile techniques may be modified in order to take into account the source level registers to be exposed.

Following compilation in step 66, in step 68 the timing checker inside the compiler is used to determine if the performance goals for the design have been met. Also, timing simulations are used to check performance details. In addition, other analysis tools such as a design profiler and/or layout editor can be used to further optimize the performance of the design. Preferably, optimization is not performed prior to step 68 because full compilation is usually required to establish the location of one or more critical paths within the design. The designer may also return to step 54 to modify the top-level block or to step 58 to implement a block again.

Next, in step 70 the device is programmed/configured using programming unit 14 and tested in the system. Again, the designer may also return to step 54 to modify the top-level block or to step 58 to implement a block again. While methodology 50 presents a top-down design process, it may also be used to support a bottom-up type methodology. Now that a general design methodology has been described by which an engineer may develop a design for a PLD, a technique for exposing internal registers of a PLD will now be discussed.

Expose Internal Registers

Figure 3:
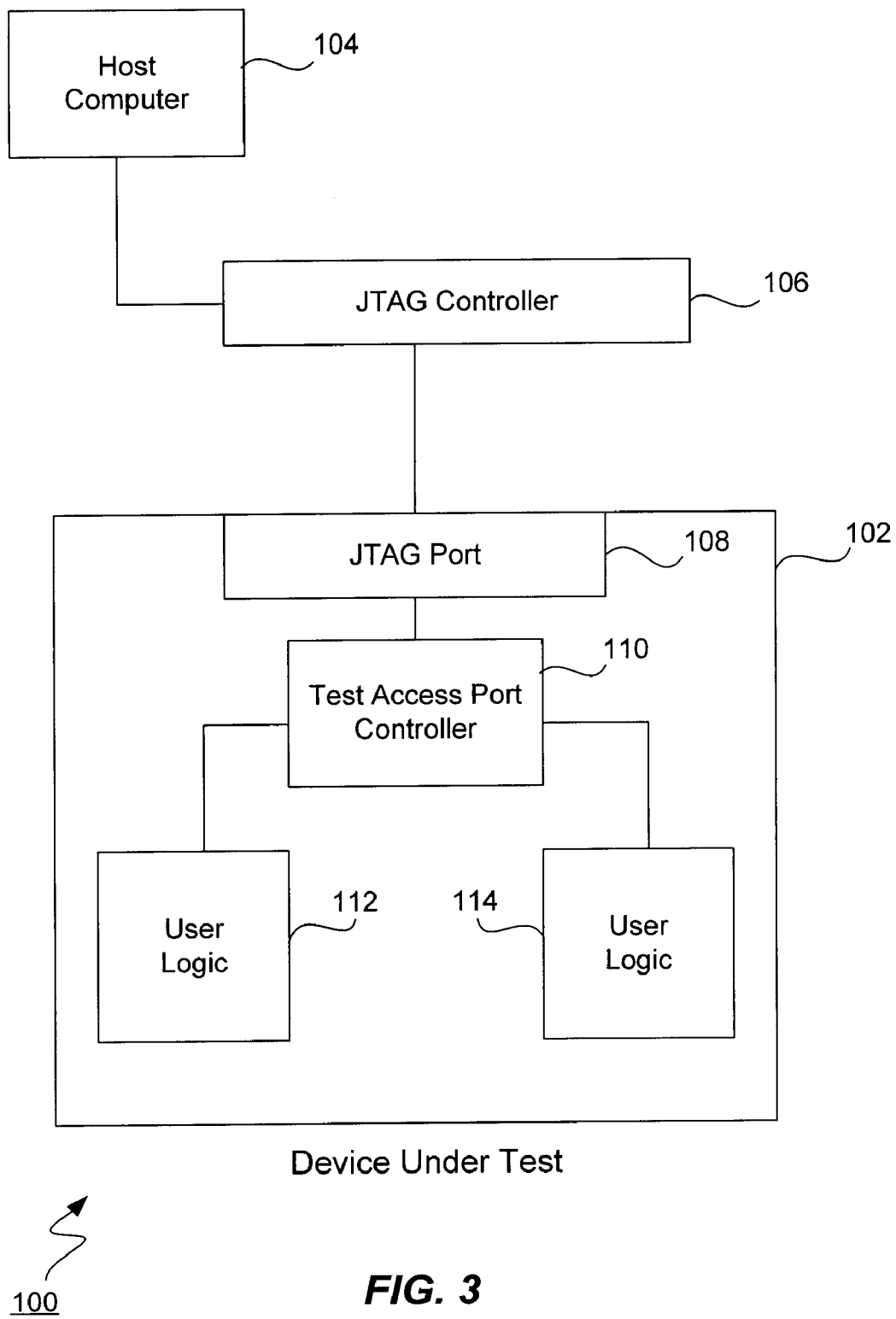
FIG. 3 is a block diagram illustrating a programmable logic device under test.

FIG. 3 is a block diagram illustrating a programmable logic device under test. Device under test 102 is any suitable programmable device as described above. Host computer 104 includes an improved EDA software tool for creating and compiling an electronic design, along with other associated software. In one specific embodiment, the EDA tool is the QUARTUS development software available from Altera Corporation of San Jose, Calif.

JTAG controller 106 is used for communication between the computer and device under test using JTAG port 108. The device also includes a test access port (TAP) controller 110 and user log blocks 112 and 114. JTAG (Joint Test Action Group) port 108 is implemented under the IEEE 1149.1 standard and is known to those of skill in the art. Using host computer 104 an engineer creates an electronic design, identifies registers of interest, complies and loads the design onto device 102. During debugging the scanned results of registers of interest are scanned out of the device via JTAG port 108 back up to the host computer for viewing by the engineer.

Figure 4:
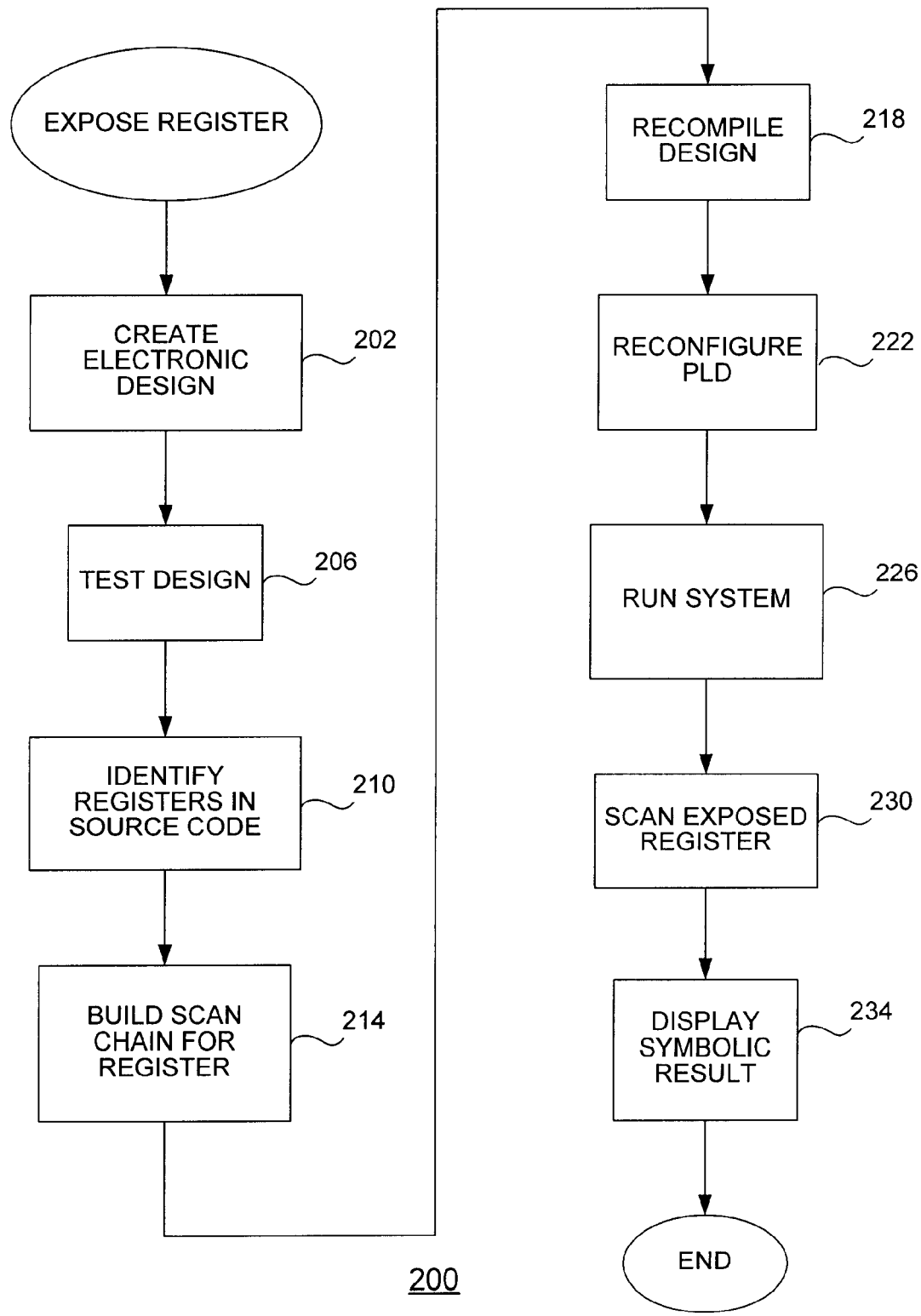
FIG. 4 is a flow chart describing a technique for exposing a register in a PLD.

FIG. 4 is a flow chart describing a technique for exposing a register in a PLD. In this embodiment of the present invention, an automated "source-to-source" debugging tool is described. The tool not only allows identification of registers in the source code, but also provides results in a source code format. Contrasted with a logic analyzer which might provide results in 1's and 0's (a logic level device) the present invention is able to provide symbolic output that greatly assists an engineer in debugging a design.

Briefly, the improved EDA tool provides a design engineer with an "expose" command which allows the engineer to identify registers of interest in the source code. After recompilation, these registers (which are normally hidden inside a chip) are displayed in a symbolic format to assist with debugging. In step 202 an engineer creates an electronic design for a PLD using design steps as described above with reference to FIG. 2 (for example). Typically, an engineer has written HDL source code and is using behavior simulation to program a PLD and to run a system. As part of that effort, in step 206 the engineer tests the design and discovers some problem that is best debugged by access to an internal node or register of the PLD. By the nature of the problem, and based upon his experience, the engineer will realize which register or registers are of interest.

In step 210, the engineer indicates in any suitable fashion which registers in the source code that he is interested in having displayed. The engineer can identify these registers and convey their identification to the novel EDA tool in a variety of manners. By way of example, the engineer preferably identifies these registers by their symbolic, text based names in the source code. The engineer conveys which registers are of interest to the EDA tool by manually typing their symbolic names into a separate pop-up window in the screen, by selecting a command that queries the engineer for the names of the registers, or by highlighting and "double clicking" on the symbolic names in the source code itself. At this point, the EDA tool is aware of which registers the engineer wishes to expose and of the possible values for the register.

Figure 5:
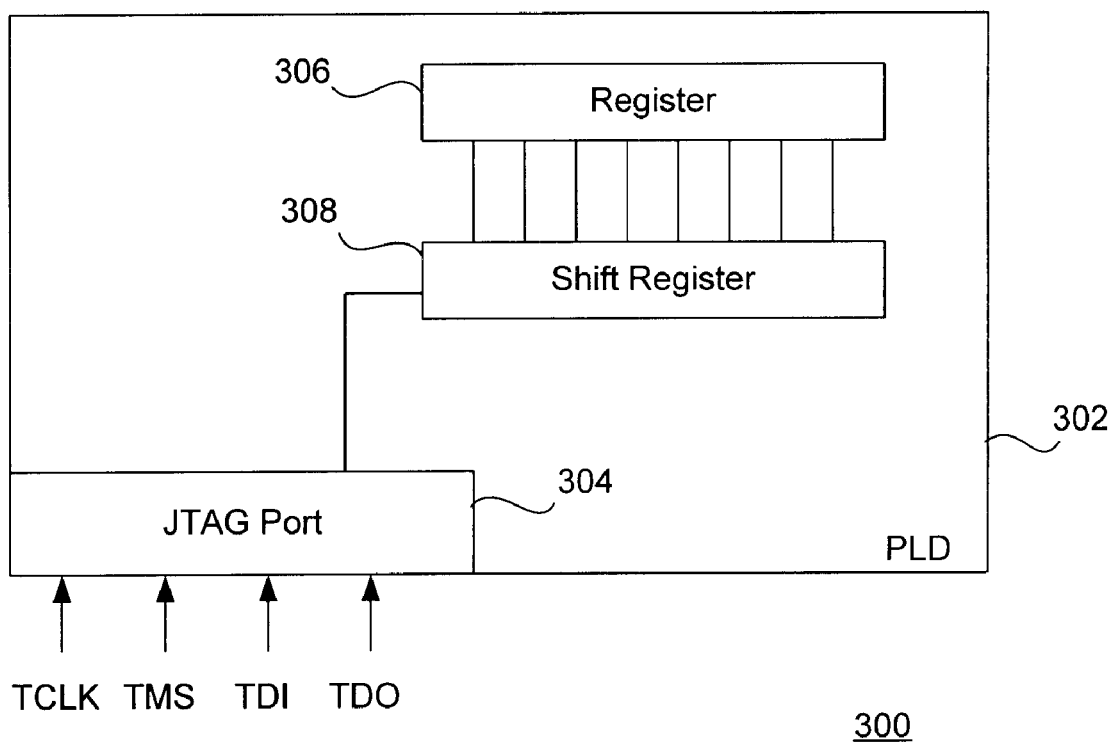
FIG. 5 illustrates an apparatus for implementing step 214 of FIG. 4.

In step 214, the EDA tool automatically builds a scan chain for each register of interest. Preferably, separate HDL code is produced to represent the scan chain which is then linked to the engineer's existing HDL code. One technique for building a scan chain for output over a JTAG port is illustrated in FIG. 5. Preferably, the HDL code representing the scan chain uses the register names identified by the engineer, thus when the new HDL code is connected to the engineer's existing code it will be compatible.

In steps 218–226 the engineer then uses the EDA tool to recompile his design, reconfigure the PLD and run the system again for testing purposes. The steps may be performed as described above with reference to FIG. 2, or in other manners as will be known to those of skill in the art. After the new electronic design (including the additional debugging scan chains) has been downloaded to the PLD and the system run, in step 230 the EDA tool automatically scans the register to be exposed and outputs the result through the JTAG port.

The EDA tool receives the output value of the exposed register and displays a result to the engineer in step 234. The result may be displayed in many different fashions. By way of example, a simply binary result as received from the JTAG port may be displayed. Preferably, as the EDA tool is aware of the symbolic name of the register from the source code, and its data type, the EDA tool may choose to display the value in a symbolic format. This symbolic format could be a decimal representation of the register value, a hexadecimal representation, the simple name of the register, its Boolean value, a symbolic name from a case statement (if the register has been used in the source code as the switch for a case statement), a particular named state of a state machine, etc.

As the EDA tool original received the identified register from the engineer in the context of the source code, the EDA tool is aware of that context and can display a symbolic result to the engineer that is more meaningful then simply a binary value such as might be displayed from a typical logic analyzer.

At this point in time, the engineer is also provided with the option of giving a "loop" command such that step 230 is executed again and the register is scanned one more time and its result displayed again. This looping is useful if the register contents may change while the design executes. Alternatively, the engineer may insert breakpoints within the source code such that when a break point is reached, the EDA tool automatically, scans any register to be exposed and outputs its value over the JTAG port. If the engineer directs that execution begin after a breakpoint, then the register in question may be exposed again when another breakpoint is reached and the value downloaded and again displayed.

FIG. 5 illustrates an apparatus 300 for implementing step 214 of FIG. 4. In this embodiment PLD 302 to be programmed includes a JTAG port 304 and register 306 which an engineer desires to view. Step 214 implements a scan chain by inserting an additional shift register 308 into the electronic design for each register that is to be viewed. Register 306 is connected to the shift register in parallel such that the contents of register 306 may be loaded to the shift register at the same time. Once loaded, the contents of the shift register are shifted out bit-by-bit over the TDO (data out) line of the JTAG port. Of course, other similar techniques for shifting out the contents of a register through a JTAG port will be known to those of skill in the art upon the reading of this disclosure.

Figure 6:
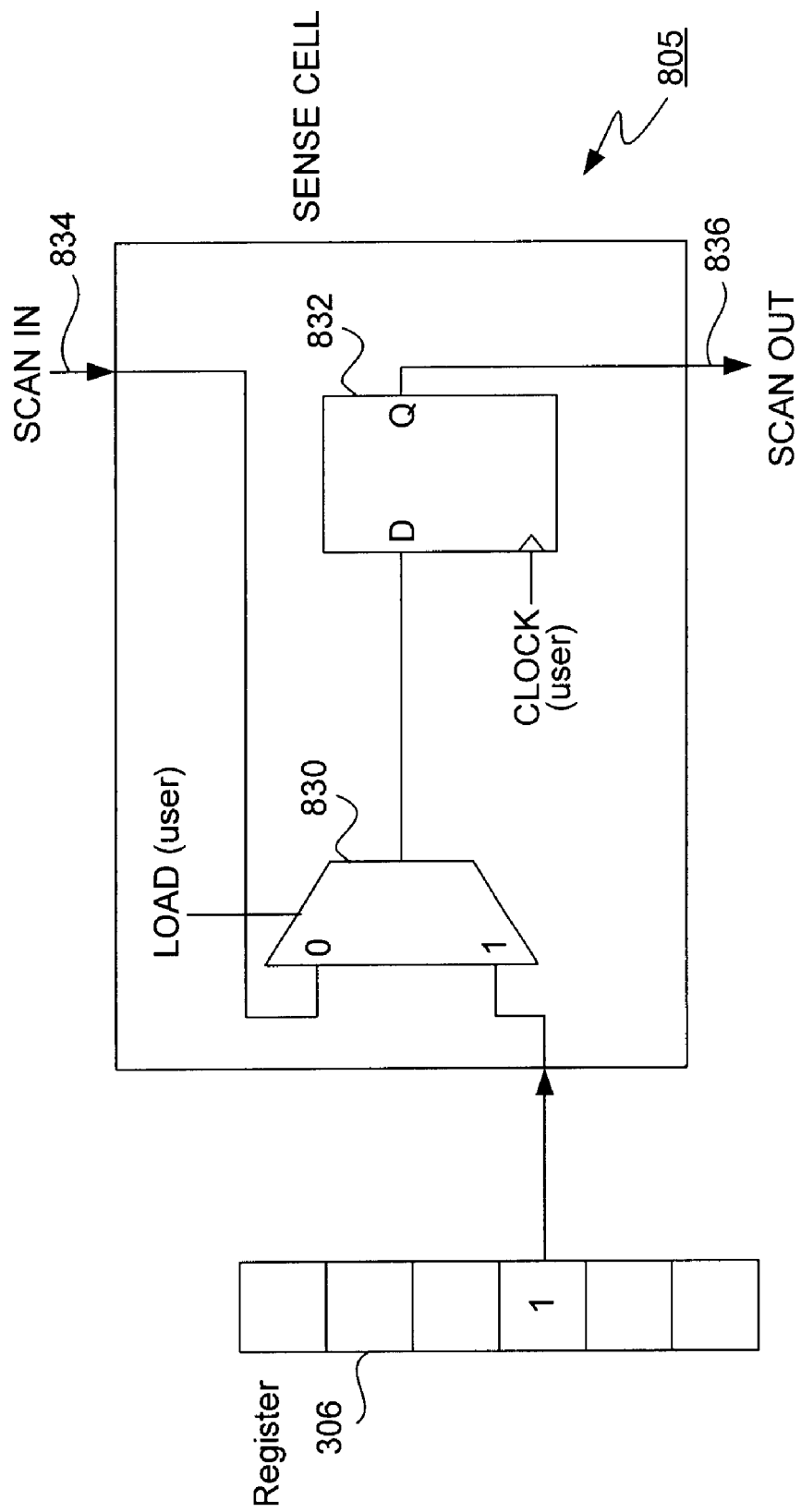
FIG. 6 is a sense cell which may be used to implement the shift register of FIG. 5.

FIG. 6 is a sense cell which may be used to implement the shift register of FIG. 5. Sense cell 805 receives scan in data over line 834 and sends out data over scan out line 836. Data is scanned in through the cell into latch 832 and scanned out on the next clock signal when no data is being loaded. When data is being loaded, for example from a bit location in register 306, a load signal passes the bit through multiplexer 830 into latch 832 from where it may be scanned out subsequently. Upon review of this disclosure, one of skill in the art would find it straightforward to implement a series of these sense cells that would load bits from register 306 in parallel and then scan out the bits to a JTAG port. Other modifications on this scanning technique may also be used.

Figure 7:
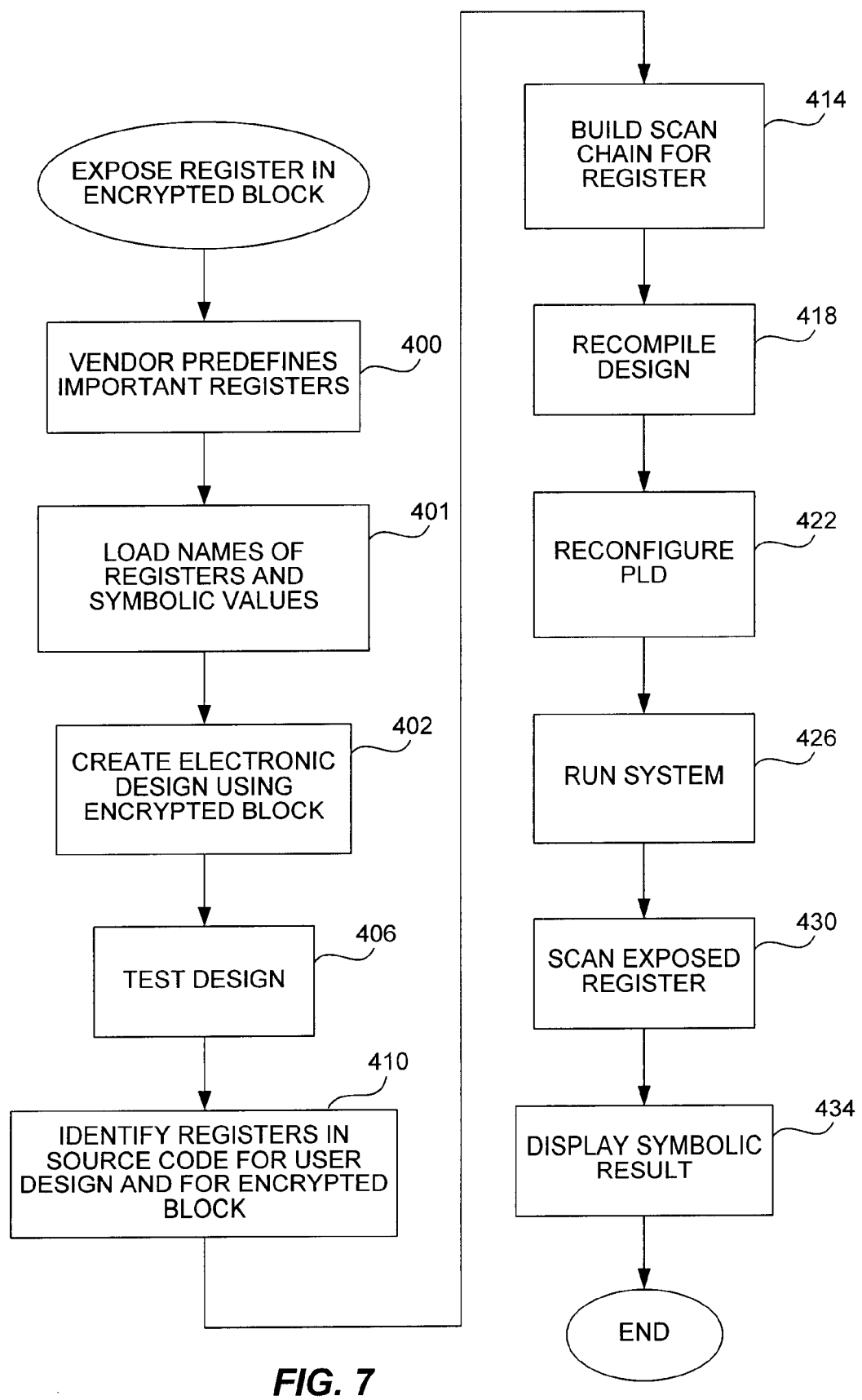
FIG. 7 is a flow chart describing a technique for exposing a register in an encrypted block.

FIG. 7 is a flow chart describing a technique for exposing a register in an encrypted block. In the course of creating an electronic design for an integrated circuit, it is common to use a block of predefined circuitry (typically called a "core") from a vendor. These blocks are also called "intellectual property blocks" are simply "IP" blocks. These cores have a predefined functionality and are useful for incorporating into a design to create a working system more efficiently. To protect their technology, most vendors will encrypt these cores so that the user may not discover their internal workings. Thus, the user receives encrypted source code which is straightforward to incorporate into an electronic design. Any of a variety of known software tools will then decrypt this encrypted core during compilation. Unfortunately, because the internal design of the encrypted block is not visible, and because the source code is also encrypted, an engineer cannot view the contents of internal registers in order to debug the overall system. This embodiment of the present invention provides a solution to this problem.

Before a particular encrypted block is sold to a user, the vendor of the block decides (step 400) which registers are of importance or would be interesting to view for an engineer who is attempting to debug an electronic design. The vendor may select these registers on their own, or may select registers based upon input from its various customers. Once these registers are selected, the vendor creates a "debugging" file which is delivered to the customer along with the encrypted block. The "debugging" file contains the names of the registers (unencrypted) in the source code to which a user will have access. Associated with each register name is the corresponding syntax for that register, i.e., the symbolic values for the register which will aid an engineer in debugging. The prior art is deficient in this respect. For example, a prior art debugging command might result in the cryptic output:

$1N51341/BLOCK1/BLOCK2/BLOCK3/NODE4=1.

This output indicates that a particularly important register in the design has a value of "1", but it is not immediately clear which register. After a certain amount of effort, the engineer would discover that this register is the STATUS register and the value of the numeral "1" means that the status is "wait for packet." Cryptic outputs like these in the prior art make it more difficult for an engineer to debug a design.

By contrast, this embodiment of the present invention provides more meaningful results. The debugging file from the vendor contains the source code symbolic name of the register, its data type and its various values so that the EDA tool can provide the engineer with more meaningful results. For example, considering the case of the status register, and entry in the debugging file may occur thus:

| STATUS | 1 | WAIT FOR PACKET |
|--------|---|-----------------|
|        | 0 | BUFFER FULL     |

An entry in the debugging file is created for each register and of course may be more complicated. By way of example, each register may have any number of values depending upon its size. The data type may be binary, decimal, hexadecimal, Boolean, may represent a switch value in a case statement, etc. The simple creation of this debugging file creates advantages for the block vendor because the vendor does not have to change their source code, does not have to reveal their source code, and can simply identify register names and values which are to be used by the EDA tool.

Once the user receives the encrypted block and the debugging file from the vendor, the user then loads this debugging file into the EDA tool in step 401. Thus, the source code name of the register and its actual and symbolic values are incorporated into the EDA tool so that it may display meaningful debugging results to the engineer. These register names and their symbolic values may of course be loaded into the EDA tool in other manners (such as described in step 210 above) but it is preferred to use a debugging file from the vendor.

In step 402 the engineer creates an electronic design using not only their own user design, but also the encrypted block received from the vendor. One of skill in the art is well able to create their own electronic design using an encrypted block from a third party. In step 406 the engineer tests the design and discovers some problem that is best debugged by access to an internal node or register of the encrypted block of the PLD. By the nature of the problem, and based upon his experience, the engineer will realize which register or registers are of interest in the encrypted block.

In step 410, the engineer indicates in any suitable fashion which registers in the source code that he is interested in having displayed. The engineer can identify these registers and convey their identification to the novel EDA tool in a variety of manners. By way of example, the engineer preferably identifies these registers by their symbolic, text based names in the source code. The engineer conveys which registers are of interest to the EDA tool by manually typing their symbolic names into a separate pop-up window in the screen, by selecting a command that queries the engineer for the names of the registers, or by highlighting and "double clicking" on the symbolic names in the source code itself. The EDA tool may also display on screen the limited number of registers available for viewing in the encrypted block. At this point, the EDA tool is aware of which registers the engineer wishes to expose and of the possible values for the register.

In step 414, the EDA tool automatically builds a scan chain for each register of interest in the encrypted block. Preferably, separate HDL code is produced to represent the scan chain which is then linked to the engineer's existing HDL code. One technique for building a scan chain for output over a JTAG port is illustrated in FIG. 5.

In steps 418–426 the engineer then uses the EDA tool to recompile his design, reconfigure the PLD and run the system again for testing purposes. The steps may be performed as described above with reference to FIG. 2, or in other manners as will be known to those of skill in the art.

After the new electronic design (including the additional debugging scan chains) has been downloaded to the PLD and the system run, in step 430 the EDA tool automatically scans the register to be exposed and outputs the result through the JTAG port.

The EDA tool receives the output value of the exposed register and displays a result to the engineer in step 434. The result may be displayed in many different fashions. By way of example, a simply binary result as received from the JTAG port may be displayed. Preferably, as the EDA tool is aware of the symbolic name of the register from the source code, and its data type, the EDA tool may choose to display the value in a symbolic format. This symbolic format could be a decimal representation of the register value, a hexadecimal representation, the simple name of the register, its Boolean value, a symbolic name from a case statement (if the register has been used in the source code as the switch for a case statement), a particular named state of a state machine, etc.

Computer System Embodiment

Figure 8A:
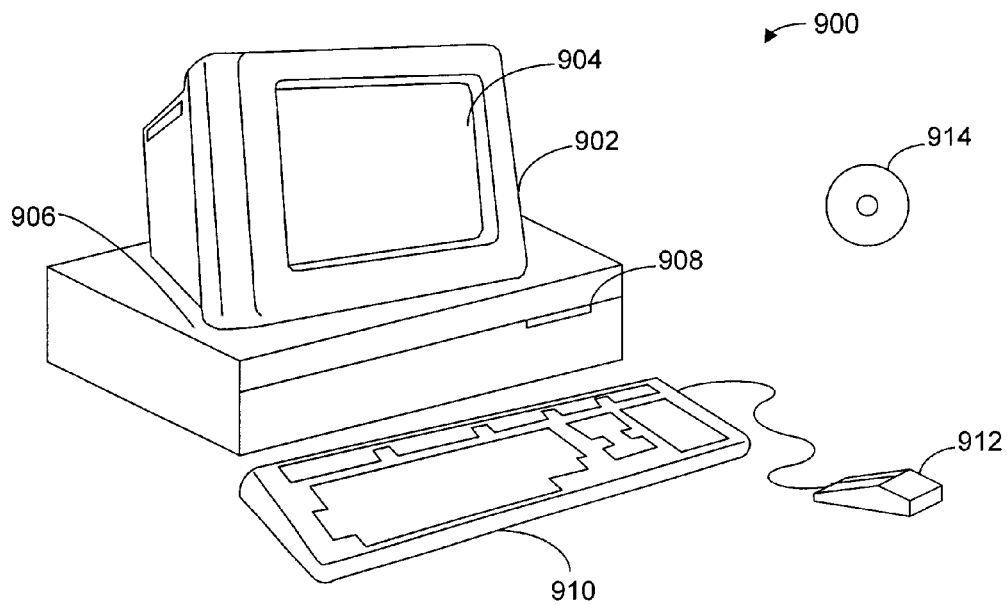
FIGS. 8A and 8B illustrate a computer system suitable for implementing any of the computers of FIG. 1 or 3, and for hosting an EDA tool.
Figure 8B:
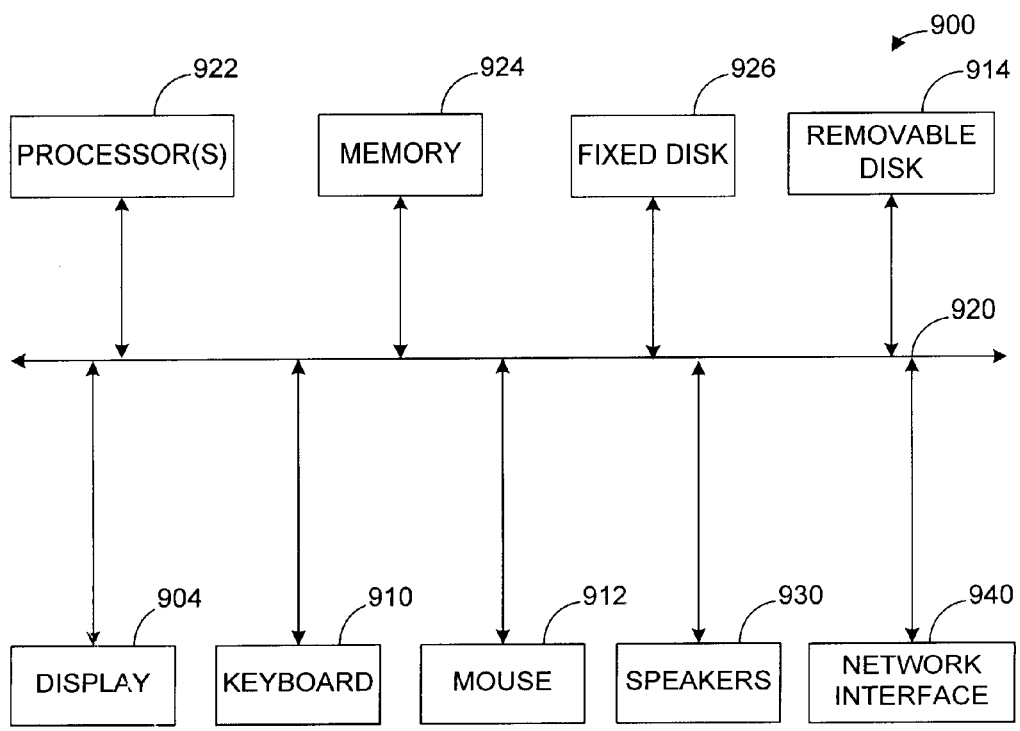

FIGS. 8A and 8B illustrate a computer system 900 suitable for implementing any of the computers of FIGS. 1 or 3, and for hosting an EDA tool. FIG. 8A shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 8B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A programmable logic device (PLD) comprising:
   user-defined logic;
   vendor-defined logic that originates from an encrypted block of source code, said vendor-defined logic including at least one register of interest;
   a JTAG port arranged to transmit data to and from said PLD; and
   means for shifting the contents of said register of interest out of said PLD via said JTAG port in response to receiving an indication of said register of interest, whereby said contents of said register of interest may be viewed by a user.

2. A PLD as recited in claim 1 wherein said means is a scan chain.

3. A PLD as recited in claim 1 wherein said means utilizes a shift register.

4. A PLD as recited in claim 1, wherein said means is automatically generated upon said indication.

5. A PLD as recited in claim 1, wherein said contents is provided in source code.

6. A PLD as recited in claim 1, wherein said indication is provided in source code by said user.

7. An electronic design for a programmable logic device (PLD) comprising:
   user-defined logic that is unencrypted;
   an encrypted block of logic that includes at least one register of interest;
   a storage location indicating that a user desires to view said register of interest;
   a JTAG port arranged to transmit data to and from said PLD; and
   means for shifting the contents of said register of interest out of said PLD via said JTAG port in response to receiving an indication of said register of interest, whereby said contents of said register of interest may be viewed by said user.

8. An electronic design as recited in claim 7 wherein said means is a scan chain.

9. An electronic design as recited in claim 7 wherein said means utilizes a shift register.

10. An electronic design as recited in claim 7 further comprising:
    an electronic file that includes a symbolic name for said register of interest.

11. An electronic design as recited in claim 7, wherein said means is automatically generated upon said indication.

12. An electronic design as recited in claim 7, wherein said contents is provided in source code.

13. An electronic design as recited in claim 7, wherein said indication is provided in source code by said user.

14. A method of exposing the contents of a register in a programmable logic device (PLD), said method comprising:
    receiving a user electronic design generated by a user;
    receiving an encrypted block of source code intended for integration with said user electronic design;
    receiving an indication of a register of interest located in said encrypted block of source code;
    a step for performing a function of linking said register of interest to an output of said PLD, whereby the contents of said register of interest may be shifted out of said PLD for viewing by said user.

15. A method as recited in claim 14 wherein said function of linking includes:
    building a scan chain; and
    connecting said scan chain to a JTAG port of said PLD.

16. A method as recited in claim 14 further comprising:
    receiving an electronic file that includes a symbolic name for said register of interest, whereby said register is identified in said encrypted block.

17. A computer-readable medium comprising computer code for exposing the contents of a register in a programmable logic device (PLD), said computer code of said computer-readable medium effecting the following:
    receiving a user electronic design generated by a user;
    receiving an encrypted block of source code intended for integration with said user electronic design;
    receiving an indication of a register of interest located in said encrypted block of source code;
    a step for performing a function of linking said register of interest to an output of said PLD, whereby the contents of said register of interest may be shifted out of said PLD for viewing by said user.

18. A programmable logic device (PLD) comprising:
    user-defined logic;
    vendor-defined logic that originates from an encrypted block of source code, said vendor-defined logic including at least one register of interest;
    a JTAG port arranged to transmit data to and from said PLD; and
    a scan chain arranged to load the contents of said register of interest and to shift the contents out of said PLD via said JTAG port in response to receiving an indication of said register of interest, whereby said contents of said register of interest may be viewed by user.

* * * * *